(12) United States Patent
Ahmad et al.

(10) Patent No.: US 9,204,548 B2
(45) Date of Patent: Dec. 1, 2015

(54) ELECTRONIC DEVICES MOUNTED ON MULTIPLE SUBSTRATES

(75) Inventors: Mudasir Ahmad, San Jose, CA (US); Percy Aria, Saratoga, CA (US)

(73) Assignee: Cisco Technology, Inc, San Jose, CA (US)

( * ) Notice: Subject to any disclaimer, the term of this patent is extended or adjusted under 35 U.S.C. 154(b) by 663 days.

(21) Appl. No.: 13/419,824

(22) Filed: Mar. 14, 2012

(65) Prior Publication Data

US 2013/0242496 A1 Sep. 19, 2013

(51) Int. Cl.
| | |
|---|---|
| *H05K 7/10* | (2006.01) |
| *H05K 7/12* | (2006.01) |
| *H05K 1/14* | (2006.01) |
| *H05K 3/34* | (2006.01) |
| *H05K 3/36* | (2006.01) |

(52) U.S. Cl.
CPC .............. *H05K 1/141* (2013.01); *H05K 7/1092* (2013.01); *H05K 3/3436* (2013.01); *H05K 3/368* (2013.01); *H05K 2201/042* (2013.01); *H05K 2201/10325* (2013.01); *H05K 2201/2036* (2013.01); *Y10T 29/49126* (2015.01)

(58) Field of Classification Search
CPC ....... H05K 1/144; H05K 1/181; H05K 1/117; H05K 2201/10689; H05K 3/4611; H05K 3/4688; H05K 1/145; H05K 2201/10515; H05K 2201/1053; H05K 7/023; H05K 361/79; H05K 361/803; H05K 361/784
USPC .................. 361/770–790, 803; 257/685–687
See application file for complete search history.

(56) References Cited

U.S. PATENT DOCUMENTS

| | | | | |
|---|---|---|---|---|
| 5,734,555 | A * | 3/1998 | McMahon ..................... | 361/704 |
| 5,742,477 | A * | 4/1998 | Baba ............................. | 361/704 |
| 5,793,998 | A * | 8/1998 | Copeland et al. ............. | 710/305 |
| 6,109,929 | A * | 8/2000 | Jasper .............................. | 439/74 |
| 6,477,593 | B1 * | 11/2002 | Khosrowpour et al. ...... | 710/100 |
| 6,483,718 | B2 * | 11/2002 | Hashimoto ................... | 361/803 |
| 7,719,850 | B2 * | 5/2010 | Duerbaum et al. ........... | 361/760 |
| 2010/0090325 | A1* | 4/2010 | Uematsu et al. .............. | 257/686 |

OTHER PUBLICATIONS

Emulation Technology, Inc., Flexible Interconnect System, Nov. 24, 2006 (dated identified by the Internet Archive Way Back Machine (included)).

\* cited by examiner

*Primary Examiner* — Tuan T Dinh
(74) *Attorney, Agent, or Firm* — Edell, Shapiro, Finnan, LLC (57) ABSTRACT

An apparatus includes a first electronic device mounted on a first substrate and a second electronic device mounted on a second substrate. In some embodiments, the second substrate is configured to be removably connected to the first electronic device. The second electronic device is mountable on either planar surface of the second substrate.

19 Claims, 8 Drawing Sheets

Fig. 11

ELECTRONIC DEVICES MOUNTED ON MULTIPLE SUBSTRATES

FIELD

The present embodiments relate to substrate configurations and more particularly, to electronic devices mounted on multiple substrates.

BACKGROUND

Integrated circuits (ICs) configured to process data at high bandwidths may need large amounts of memory to store and access information in order to process the data. Memory integral to the integrated circuit may not be large enough to store the information, and so memory devices separate from the integrated circuit may be used to store all or some of the information.

DETAILED DESCRIPTION

Overview

BRIEF DESCRIPTION OF THE DRAWINGS

An apparatus includes a first substrate; a second substrate; a first electronic device mounted on the first substrate; and a second electronic device mounted on a second substrate. The first electronic device is configured to communicate with the second electronic device via a path extending through the first substrate and the second substrate. In addition, the first substrate is mounted on a third substrate.

DESCRIPTION OF EXAMPLE EMBODIMENTS

The present disclosure describes an apparatus that includes a first electronic device mounted on a first substrate and a second electronic device mounted on a second substrate. The first electronic device and the second electronic device may be configured to communicate with each other via electrical connections that pass through at least one of the first substrate and the second substrate. In comparison with configurations where the first electronic device and the second electronic device are mounted on a single substrate, the first and second substrates of the apparatus of the present disclosure are configured, oriented, and/or positioned to increase a surface area on which the first and second electronic devices are mounted without increasing or substantially increasing the two-dimensional or planar dimensions of the apparatus.

Figure 1:
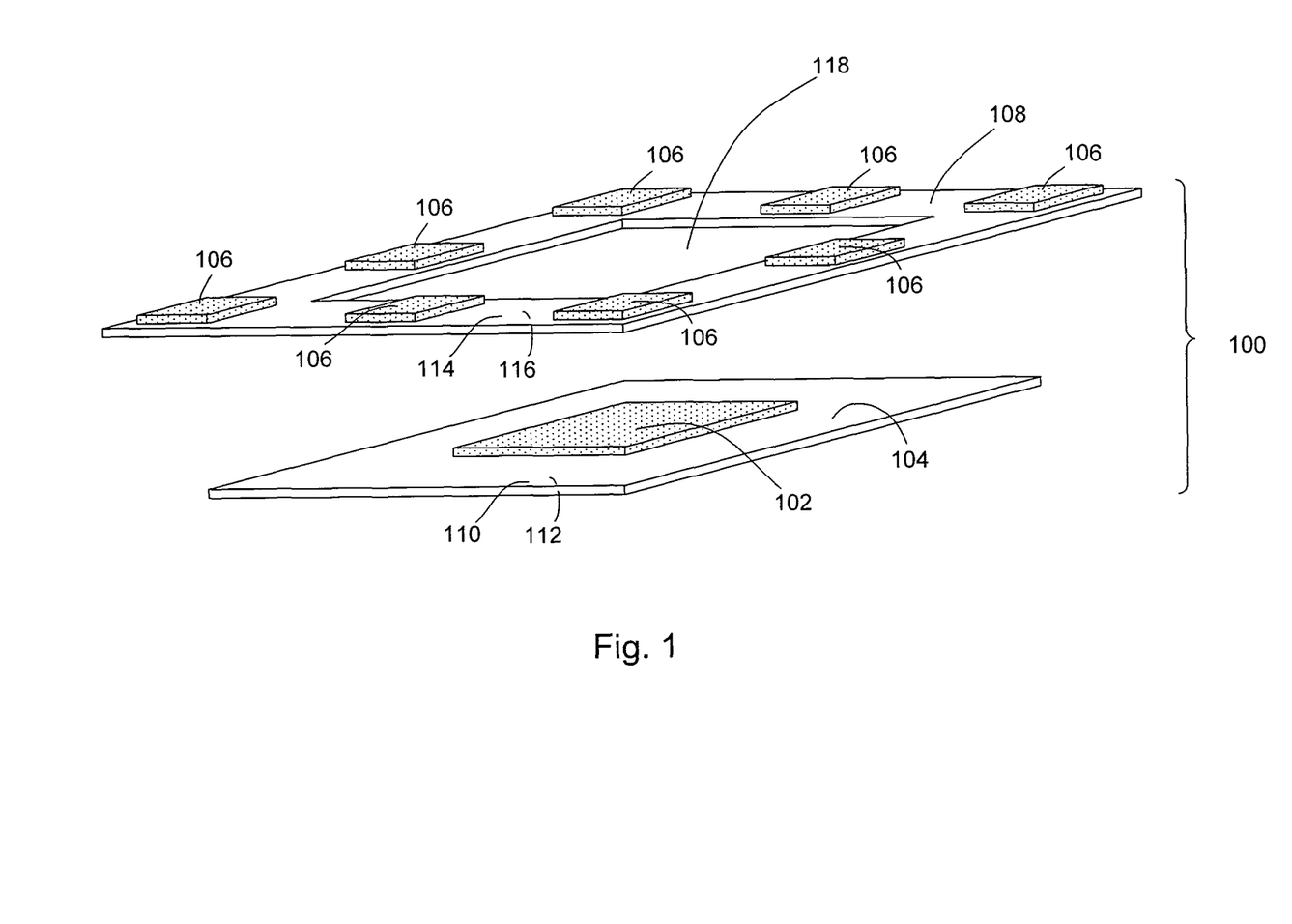
FIG. 1 illustrates an exploded perspective view of an example apparatus having a first electronic device mounted on a first substrate and a second electronic device mounted on a second substrate.

FIG. 1 shows an exploded perspective view of an example apparatus 100 that includes a first electronic device 102 that is mounted on a first substrate 104 and at least one second electronic device 106 mounted on a second substrate 108. The example apparatus 100 may be a router or a switch, although the example apparatus 100 is not so limited and in general may be any apparatus that has multiple substrates, each of which is configured to have at least one electronic device mounted on it. In addition, the electronic devices may include any of a variety of semiconductor and/or active electronic devices, such as an integrated circuit (IC) (e.g., a field programmable gate array (FPGA) or an application specific integrated circuit (ASIC)), a programmable logic device (PLD), a memory chip, a controller, a microcontroller, a processor, a central processing unit (CPU), a transistor, a diode, an operational amplifier, or any other electronic device, circuit, or component that may require power, such as DC power, to operate. In some configurations, the first electronic device 102 and/or the second electronic devices 106 may have one or more Serializer/Deserializer (SerDes) interfaces. The electronic devices 102, 106 may be configured to be mounted on the first substrate 104 and/or the second substrate 108 and may also be configured to communicate with each other. Where the at least one second electronic device 106 includes multiple electronic devices, the electronic devices may be of a same type (e.g., two memory chips) or of a different type (e.g., a memory chip and an ASIC). Various configurations are possible. In addition, one or more of the active devices may also communicate with a passive device, such as a resistor, a capacitor, or an inductor mounted on the first or second substrates 104, 108.

The first substrate 104 and the second substrate 108 may be planar structures and may be positioned parallel or substantially parallel to each other. Each of the substrates 104, 108 may have opposing planar surfaces. For example, the first substrate 104 has a top planar surface 110 that opposes a bottom planar surface 112. Similarly, the second substrate 108 has a top planar surface 114 that opposes a bottom planar surface 116. Herein, the terms "top" and "bottom" are used to describe the relative position of the substrates, as well as other components mounted on and/or connected to the substrates in the embodiments. However, these terms should not be construed as limiting the relative positioning of the substrates since the substrates as a group can be in any orientation resulting in substantially parallel positioning between the substrates.

The first substrate 104 and the second substrate 108 may be positioned and/or aligned so that one of the top and bottom surfaces 110, 112 of the first substrate 104 faces one of the top and bottom surfaces 114, 116 of the second substrate 108. For example, as shown in FIG. 1, the top surface 110 of the first substrate 104 may face the bottom surface 116 of the second substrate 108.

The first device 102 may be mounted on the top surface 110 or the bottom surface 112. For example, as shown in FIG. 1, the first device 102 is mounted on the top surface 102. In addition, the at least one second device 106 may be mounted on the top surface 114. In addition or alternatively, the at least one second device 106 may be mounted on the bottom surface 116, as further shown and described with reference to FIGS. 7 and 8. The first device 102 and the second device 106 may be mounted on their respective substrates 104, 108 using various surface mount technologies, depending on the type of the electronic device. One example technology may use ball grid arrays (BGAs).

The second substrate 108 may form or define a space, gap, or void 118 where the second devices 106 are not mounted. In one configuration, the second substrate 108 may be a contiguous structure that surrounds the space 118, forming a frame or a ring around the space 118. The second substrate 108 may be positioned relative to the first substrate 104 so that an area of the first substrate 104 is aligned with the space 118. The first device 102 may be mounted on the first substrate 104 in the area.

The second electronic devices 106 may be mounted on the second substrate 108. As shown in FIG. 1, the second electronic devices 106 may be mounted on the second substrate 108 such that the second electronic devices surround the space 118. In some example configurations, the second electronic devices 106 may completely surround the space 118. In other example configurations, the second electronic devices 106 may partially surround the space 118. As shown in FIG. 1, the second electronic devices 106 may equally spaced or equidistant from each other and/or in a symmetric relationship with respect to each other. Alternatively, the second electronic devices 106 may be unequally spaced apart from each other and/or in an asymmetric relationship with each other. Various configurations are possible.

In addition, FIG. 1 shows eight second electronic devices 106 mounted on the top surface 114 of the second substrate 108. However, any number and at least one second electronic device 106 may be mounted on the top surface 114. In addition or alternatively, any number and at least one second electronic device 106 may be mounted on the bottom surface 116. At a minimum, one second electronic device 106 may be mounted on the top surface 114 or the bottom surface 116 of the second substrate 108. Also, FIG. 1 shows a single first electronic device 102 mounted on the top surface 110 of the first substrate. Alternatively, multiple first electronic devices 102 may be mounted on the top surface 110. The multiple first electronic devices 102 may be in electrical communication with each other, and each or both may be in electrical communication with one or more of the second electronic devices 106. In some examples, a configuration of the second electronic devices 106 mounted on the top surface 114 may be the same as and/or symmetrical to a configuration of the second electronic devices 106 mounted on the bottom surface 116. In alternative examples, a configuration of the second electronic devices 106 mounted on the top surface 114 may be different from and/or asymmetrical to a configuration of the second electronic devices 106 mounted on the bottom surface 116. Various configurations are possible.

Figure 2:
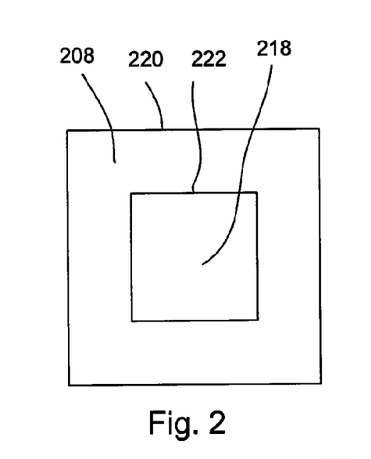
FIG. 2 illustrates a top view of an example configuration of a substrate configured to mount an electronic device.

FIGS. 2-6 show top views of various example configurations of a substrate that can be used as the substrate 108 shown in FIG. 1. FIG. 2 shows a top view of a contiguous substrate 208 having a rectangular or square outer perimeter 220 and a rectangular or square inner perimeter 222. In addition, the substrate 208 forms and/or defines a gap or space 218, by completely surrounding the space 218. The substrate 208 is similar to the substrate 108 shown in FIG. 1.

Figure 3:
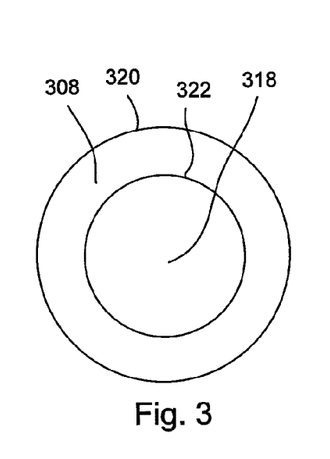
FIG. 3 illustrates a top view of a first alternative example configuration of a substrate configured to mount an electronic device.

FIG. 3 shows a top view of an alternative configuration of a substrate 308 that may be used as the second substrate 108 shown in FIG. 1. The substrate 308 shown in FIG. 3 is a contiguous substrate having a circular outer perimeter 320 and a circular inner perimeter 322. The substrate may be a ring-like structure and form and/or define a gap or space 318 by completely surrounding the space 318.

Figure 4:
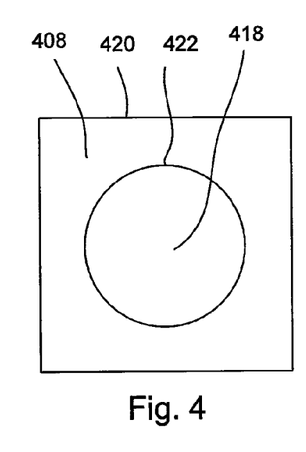
FIG. 4 illustrates a top view of a second alternative example configuration of a substrate configured to mount an electronic device.

FIG. 4 shows a top view of another alternative configuration of a substrate 408 that may be used as the second substrate 108 shown in FIG. 1. The substrate 408 shown in FIG. 4 is a contiguous substrate. Also, the configuration of the substrate 408 shown in FIG. 4 has an outer perimeter 420 that is of a different shape than the shape of the inner perimeter 422. For example, as shown in FIG. 4, the outer perimeter 420 has a rectangular or square outer perimeter 420 and a circular inner perimeter 422. Alternative substrate configurations in accordance with the configuration of the substrate 408 may reverse the shapes of the outer and inner perimeters 420, 422. That is the outer perimeter 420 may be circular and the inner perimeter 422 may be rectangular or square. Also, the configuration of the substrate 408 differs from the configurations of the substrates 208, 308 shown in FIGS. 2 and 3 respectively, in that the outer perimeters and the inner perimeters for each of the substrates 208, 308 have the same or substantially the same shape. For example, the outer perimeter 220 and the inner perimeter 222 of the substrate 208 both have a rectangular or square shape. Similarly, the outer perimeter 320 and the inner perimeter 322 both have a circular shape.

Figure 5:
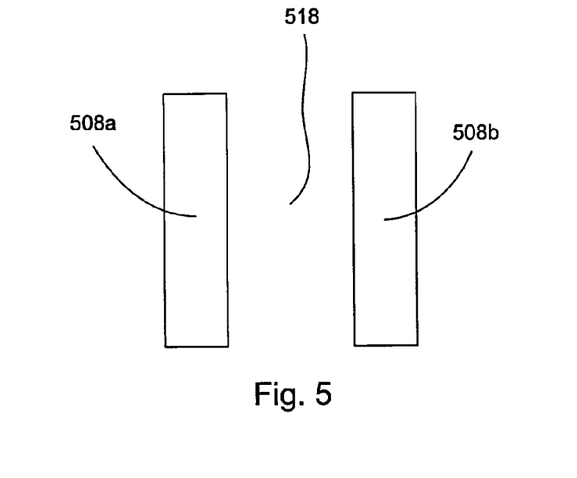
FIG. 5 illustrates a top view of third alternative example configuration of a substrate configured to mount an electronic device.

FIG. 5 shows a top view of a third alternative configuration of a substrate 508 that may be used as the second substrate 108 shown in FIG. 1. In the configuration shown in FIG. 5, the substrate 508 is a discontiguous substrate that includes multiple separate pieces or components 508a and 508b spaced away from each other and partially surrounding a space 518.

Figure 6:
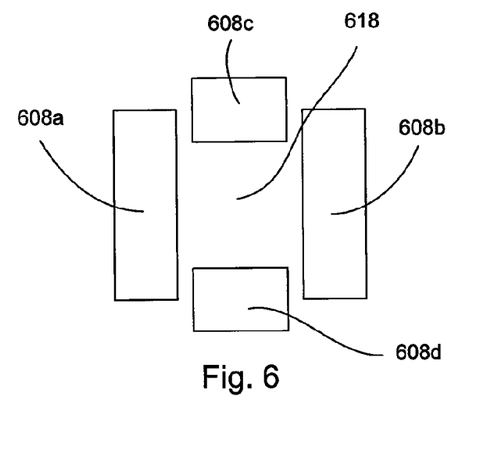
FIG. 6 illustrates a top view of a fourth alternative example configuration of a substrate configured to mount an electronic device.

FIG. 6 shows a top view of a fourth alternative configuration of a substrate 608 that may be used as the second substrate 108 shown in FIG. 1. Like the configuration of the substrate 508 shown in FIG. 5, the substrate 608 shown in FIG. 6 is also a discontiguous substrate that includes multiple pieces or components 608a, 608b, 608c, 608d. Although discontiguous and spaced away from each other, unlike the configuration shown in FIG. 5, the multiple pieces 608a-d at least substantially surround a space 618.

The substrate configurations shown in FIGS. 2-6 are non-limiting and other configurations and/or combinations of the configurations shown in FIGS. 2-6 may be used. For example, shapes other than rectangular, square, or circular may be used for the outer perimeter and/or the inner perimeter, such as polygonal shapes or oval shapes, as examples.

Figure 7A:
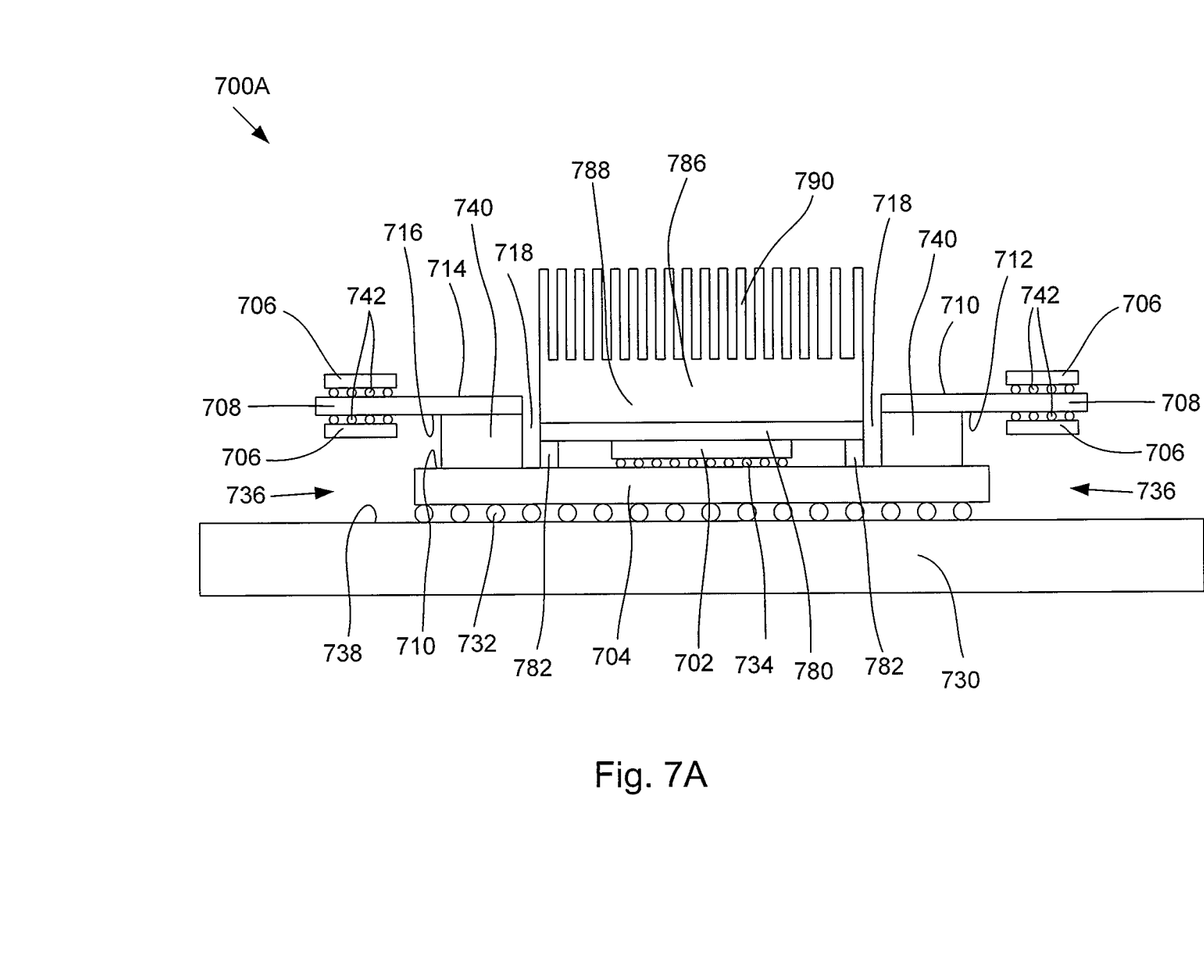
FIG. 7A illustrates a cross-sectional side view of an example apparatus having a first substrate configured to mount a first device and a second substrate configured to mount at least one second device.

FIG. 7A shows a cross-sectional side view of an example apparatus 700A that may include a first device 702 mounted on a first substrate 704 and at least one second device 706 mounted on a second substrate 708. The example apparatus 700A may be configured similar to the example apparatus 100 shown in FIG. 1 and/or in accordance with the various configurations of a substrate shown in FIGS. 2-6, which may be used for the second substrate 708. The example apparatus 700A may further include additional components used for electrical connectivity, physical support, protection, and/or thermal management.

The first substrate 704, which may be referred to as an organic substrate, may be made of a polymer or a polymer resin material, as opposed to a ceramic material. The first substrate 704 may be an intermediary substrate that electrically connects the first electronic device 702 with a third substrate 730, which may be referred to as a main board or motherboard, that connects the first electronic device 702 and/or the second electronic devices 706 with input and/or output connections of the apparatus 700A and/or other electronic devices mounted at other portions of the main board 702. The first substrate 704 may function and/or serve as a conduit or an intermediary substrate between the first electronic device 702 and the main board 730 where the pitch and spacing (which may be in the tens or hundreds of microns) of the input/output (I/O) connections of the first device 702 (which may number in the thousands, tens of thousands, or more) are too small for a feasible, reliable, and/or robust connection between the first electronic device 702 and the main board 730. The first substrate 704 may widen or "fan out" the pitch and/or spacing between the I/O connections of the first electronic device 702 so that electrical connection between the first electronic device 702 and the main board 730 may be feasible, reliable, and/or robust. Also, the first electronic device 702 may be delicate and/or fragile, and the first substrate 704 may provide support, protection, and/or encapsulation and to help prevent the first electronic device 702 from being damaged.

The first electronic device 702 may be connected to first substrate 704 using ball grid array (BGA) technology, which may include small solder bumps or balls 734 connecting input/output (I/O) connections of the first electronic device 702 with I/O connections of the first substrate 704. During assembly, after connecting the first electronic device 702 to the first substrate 704, the components may be subjected to a reflow process in an oven to form electrical joints between the first electronic device 702 and the first substrate 704. Also, an underfill, such as a polymer glue or adhesive, may be used to encapsulate the solder bumps 734 and cover them up between the first electronic device 702 and the substrate 704 to offset any undesirable affects heat may have on expansion of the bumps 734 during assembly and/or operation of the example apparatus 700A.

The main board 730 may be made of a polymer or a polymer composite, which may include a glass weave with resin. An example material may be an FR-4 glass-reinforced epoxy laminate. The main board 730 may be a substrate on which the other components of the apparatus 700A, including the first electronic device 702 and the second electronic devices 706 may be mounted. The first substrate 702 may be connected to the main board 730 using ball grid array (BGA) technology, which may include solder balls 732 connecting input/output (I/O) connections of the first electronic device 702 with I/O connections of the main board 730. In some example configurations, the solder balls 732 may be larger and/or have different dimensions in size and pitch as compared to the solder balls 734. Similar reflow methods may be used to create electrical joints between the first substrate 704 and the main board 730. Additionally, the main board 730 may include one or more layers with conductive traces, e.g., copper traces, extending through the layers. The I/O connections of the main board 730 may be connected to the conductive traces, which may electrically connect the first electronic device 702 and/or the second electronic devices 706 with other components mounted on the main board 730.

The second substrate 708 may be made of a material similar to the material of the main board 730. For example, the second substrate may be a polymer or a polymer composite, which may include a glass weave with resin, such as an FR-4 glass-reinforced epoxy laminate. Other materials may be used. Also, the second substrate may include one or more layers or sheets that include conductive traces, such as copper traces that are configured to transmit and/or propagate signals that are being sent from and/or being received by the second electronic devices 706. Any number of layers of the second substrate 708 may be used. The number may be determined by the type and/or the number of the second electronic devices 706 that are mounted on the second substrate 708. Other criteria may also be used to determine the number of layers of the second substrate.

As shown in FIG. 7A, and in accordance with the second substrate 108 shown in FIG. 1, the second substrate 708 may be oriented parallel or substantially parallel with the first substrate 704. The second substrate 708 may also be oriented parallel or substantially parallel with the main board 730. Also, the second substrate 708 may be configured to have a shape that is the same as, similar to, and/or in accordance with the shapes of the second substrate 108 shown in FIG. 1 and/or one or more of the substrates 208, 308, 408, 508, 608 shown in FIGS. 2-6. For example, the second substrate 708 may be configured to form and/or define a gap 718. Also, as shown in FIG. 7A, the first electronic device 702 may be disposed and/or mounted on an area of the first substrate 704 that is aligned with the gap 718. In addition, as described in more detail below, one or more components other than the first electronic device 702 may be aligned with and/or disposed within the gap 718.

The second electronic devices 706 may be mounted on a top surface 714 and/or the bottom surface 716. Second electronic devices 706 mounted on both the top surface 714 and the bottom surface 716 may be referred to as a clamp-shell configuration. As explained above, any number of second electronic devices 706 may be mounted on the top surface 714 and/or the bottom surface 716. The number may be determined by the application for which the apparatus 700A is being used, the type and/or size of the second electronic devices 706, the number of second electronic devices needed and/or required by system requirements or specifications of the apparatus 700A and/or of the first electronic device 702, and/or the surface area of the top surface 714 and/or the bottom surface 716, as examples. At a minimum, a second electronic device 706 is mounted and/or disposed on the top surface 714 or the bottom surface 716.

In one example configuration, as shown in FIG. 7A, the apparatus 700A may be configured to have second electronic devices 706 mounted on the bottom surface 716. Second electronic devices 706 may be mounted on the bottom surface 716 because of a space or gap 736 extending from a top surface 738 of the main board 730 to the bottom surface 716 of the second substrate 708. Also, the space 736 may extend around an outer perimeter of the first substrate 704. A distance or length of the space 716 extending from the top surface 738 of the main board 730 to the bottom surface 716 of the second substrate 708 may be determined by the first substrate (e.g., a width of the first substrate) and a size of a connector 740 that connects the second substrate 708 with the first substrate 704 and that electrically connects the second electronic devices 706 with the first electronic device 702.

The apparatus 700A may be configured so that the space 736 is unoccupied by any components, such as any electronic devices. For example, where thermal control and/or overheating for second electronic devices 706 mounted on the bottom surface 716 is of concern, the space 736 may provide a channel or passage for air flow to cool the second electronic devices 706 mounted on the bottom surface 718. Alternatively, where thermal control and/or overheating of the second electronic devices 706 is not of concern, then electronic devices, active and/or passive, which may communicate with the first electronic device 702, the second electronic devices 706, and/or other electronic devices included in the apparatus 700A, may be disposed in the space 736 and/or mounted on the top surface 738 of the main board 730 within the space 736.

As shown in FIG. 7A, the connector 740 may elevate and/or extend the second substrate 708 away from a top surface 710 of the first substrate 704 and/or the top surface 738 of the main board 730. The connector 740 may elevate and/or extend the second substrate a predetermined distance, which may be maintained by the connector 740 and/or may be defined by a length of the connector 740. The second substrate 708 may be elevated and/or extended by a predetermined distance away from the first substrate 704 as defined by a predetermined size (e.g., a predetermined length) of the connector 740. By extending the second substrate 708 away from the first substrate 704, more surface area may be created and/or formed in the apparatus 700A on which the second electronic devices 706 may be mounted. As a result, the second substrate 708 is configured to be dual-footprint compatible, and more second electronic devices 706 may be included in the example apparatus 700A and/or communicate with the first electronic device 702 without having to laterally or two-dimensionally extend or expand (or substantially extend or expand) the first substrate 704 and/or the second substrate 708. In contrast, for alternative configurations where the first electronic device 702 and the second electronic devices 706 are both mounted on the first substrate 704 (i.e., the same substrate), in order to increase the number of second electronic devices 706, the first substrate 704 may be laterally extended or expanded to increase the surface area of the top surface 710 on which the first electronic device 702 and the second electronic devices 706 are mounted. For those alternative configurations, there is no space (or at least not enough space) in between the bottom surface 712 of the first substrate 702 and the top surface 738 of the main board 730 to mount electronic devices on the bottom surface 712. Without having to laterally extend the first substrate 704, warping or warpage issues caused by increasing the size and/or footprint of the first substrate 704 may be reduce, minimized, and/or eliminated.

The second electronic devices 706 may be mounted on the top surface 714 and/or the bottom surface 716 using various technologies, which may depend on the type of the second electronic devices 706. One technology may be BGA technology, as described above. Using BGA technology, the second electronic devices 706 may be mounted on and/or connected to the second substrate 708 using solder bumps or balls 742. The solder bumps 742 may connect I/O connections of the second electronic devices 706 with conductive traces disposed on the top surface 714 and/or the bottom surface 716 of the second substrate 708. The traces may electrically connect the second electronic devices 706 with the connector 740.

The connector 740 may be configured to electrically connect conductive traces disposed on and/or in the layers of the second substrate 708 with conductive traces disposed on and/or in the first substrate 704. In turn, electrical connections may be established between the first electronic device 702 and the second electronic devices 706. The connector 740 may include one or more conductive paths that connect the conductive traces disposed on and/or in the first substrates 704 with the conductive traces disposed on and/or in the second substrate 708.

Figure 7B:
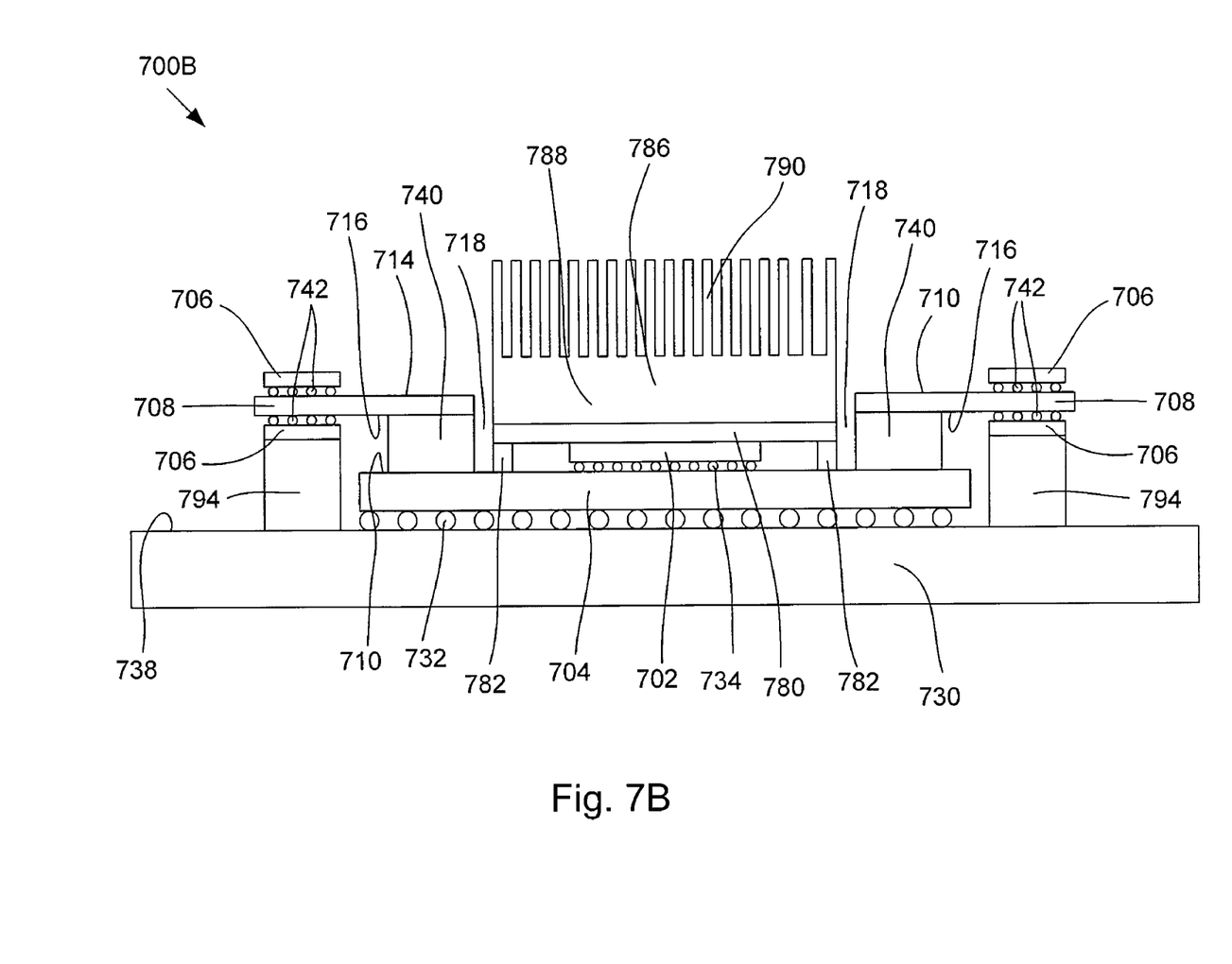
FIG. 7B illustrates a cross-sectional side view of another example apparatus having a first substrate configured to mount a first device and a second substrate configured to mount at least one second device.

FIG. 7B shows a cross-sectional side view of an example apparatus 700B that may include a first device 702 mounted on a first substrate 704 and at least one second device 706 mounted on a second substrate 708. The example apparatus 700B is the same as the example apparatus 700A, except the example apparatus 700B may include a stiffener ring 794. The stiffener ring 794 may be disposed and/or occupy all or at least some of the area occupied by the space or gap 736 shown in FIG. 7A. The stiffener ring 794 may extend from the top surface 738 of the main board 730 to second devices 206 mounted on the bottom surface 716 of the second substrate 708. Also, the stiffener ring 794 may extend around and/or at least partially surround an outer perimeter of the first substrate 704. A distance or length of the stiffener ring 794 extending from the top surface 738 of the main board 730 to the second devices mounted on bottom surface 716 of the second substrate 708 may be determined by the first substrate (e.g., a width of the first substrate) and a size of the connector 740 connecting the second substrate 708 with the first substrate 704. The stiffener ring 794 may function and/or serve as a stiffener that reduces warpage of the first substrate 704, the second substrate 708, the main board 730, and/or the apparatus 700B, generally. The stiffener ring 794 may be made of electrically conductive material, such as copper or aluminum as examples. When made of an electrically conductive material, the stiffener ring 794 may function as both a stiffener and a heatsink for the second electronic devices 706. Alternatively, the stiffener ring may be made of non-electrically conductive material.

Figure 8:
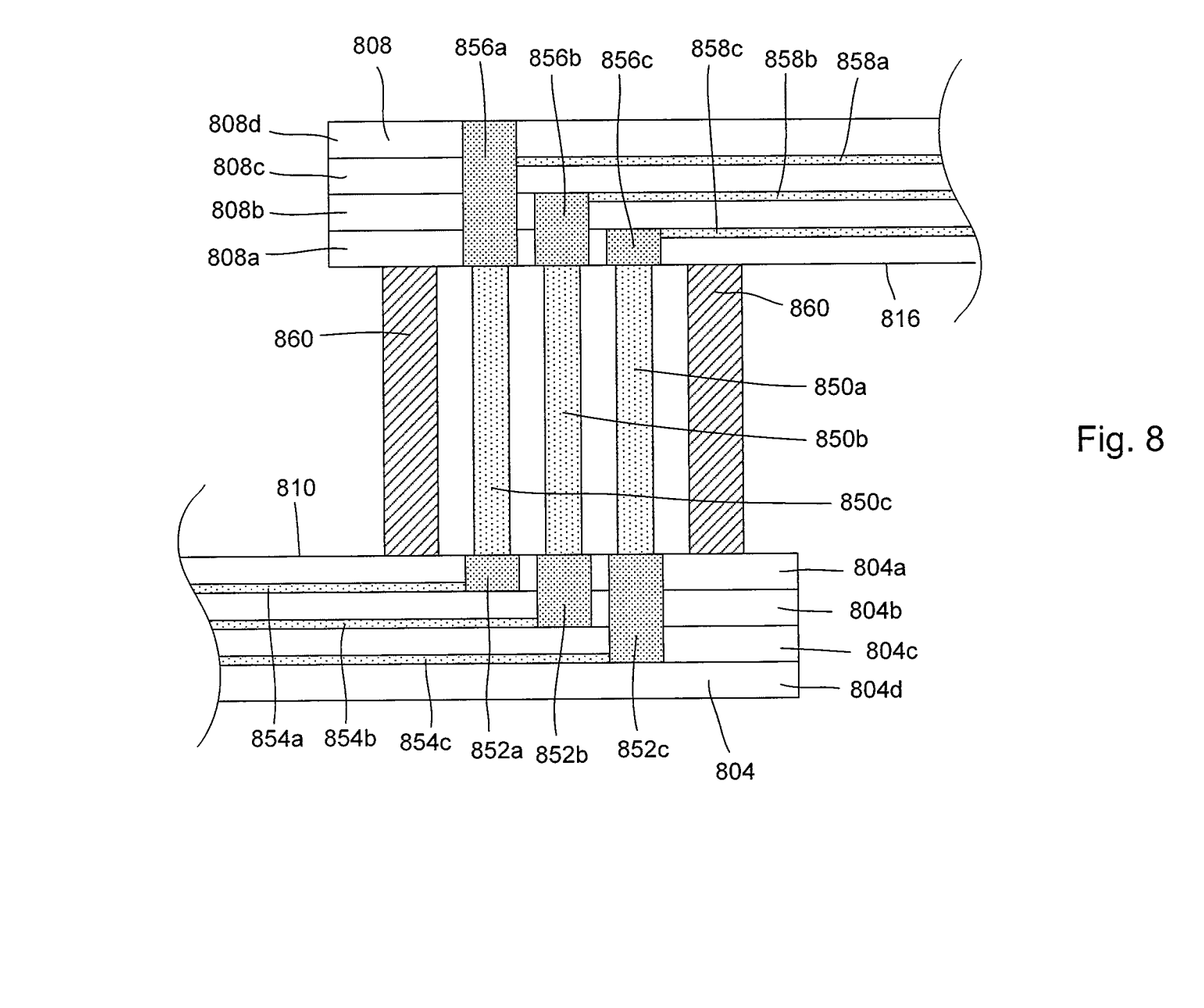
FIG. 8 illustrates a cross-sectional side view of an example connector that is configured to connect a first substrate with a second substrate.

FIG. 8 shows a cross-sectional side view of an example connector 840 that may be used as the connector 740 shown in FIG. 7A. The example connector 840 may have one or more conductive paths 850 extending a length of the connector 840. FIG. 8 shows three conductive paths 850a, 850b, 850, although any number may be used and may depend on the number of conductive traces that the conductive paths 850 are configured to connect to.

The conductive paths 850 may have ends that are connected to I/O connections 852 of a first substrate 804. The first substrate 804 may be representative of the first substrate 704 shown in FIG. 7A and/or the first substrate 104 shown in FIG. 1. The first substrate 804 may include multiple layers. FIG. 8 shows the first substrate 804 having four layers 804a, 804b, 804c, 804d, although any number of layers may be used. The I/O connections 852 may be vias extending through one or more of the layers 804a-d, as shown in FIG. 8. In alternative example configurations, one or more of the I/O connections 852 may be conductive pads mounted on a top surface 810 of the first substrate 804. Other I/O connections may be used.

The I/O connections 852 may be connected to the conductive paths 850 of the connector 840 and also to conductive traces 854 disposed on or in the first substrate 804. For example, I/O connection 852a is connected to conductive path 850a and also to conductive trace 854a disposed on a surface of the second layer 804b; I/O connection 852b is connected to conductive path 850b and also to conductive trace 854b disposed on a surface of the third layer 804c; and I/O connection 852c is connected to conductive path 850c and also to conductive trace 854c disposed on a surface of the fourth layer 804d. The connector 840 and/or the conductive paths 850 of the connector 840 may be connected to the I/O connections 852 in various ways and/or using various technologies. For example, the conductive paths 850 may be soldered to the I/O connections 852 and/or connected to the I/O connections 852 using BGA technology.

Similarly, the conductive paths 850 may have ends that are connected to I/O connections 856 of a second substrate 808. The ends connected to the I/O connections 856 may be opposing ends of the ends connected to I/O connections 852. Also, the second substrate 808 may be representative of the second substrate 708 shown in FIG. 7A and/or the second substrate 108 shown in FIG. 1. The second substrate 808 may include multiple layers. FIG. 8 shows the second substrate 808 having four layers 808a, 808b, 808c, 808d, although any number of layers may be used. The I/O connections 856 may be vias extending through one or more of the layers 808a-d, as shown in FIG. 8. In alternative example configurations, one or more of the I/O connections 856 may be conductive pads mounted on a bottom surface 816 of the second substrate 808. Other I/O connections may be used.

The I/O connections 856 may be connected to the conductive paths 850 of the connector 840 and also to conductive traces 858 disposed on or in the second substrate 808. For example, I/O connection 856a is connected to conductive path 850a and also to conductive trace 858a disposed on a surface of the fourth layer 808d; I/O connection 856b is connected to conductive path 850b and also to conductive trace 858b disposed on a surface of the third layer 808c; and I/O connection 856c is connected to conductive path 850c and also to conductive trace 858c disposed on a surface of the second layer 808b. The connector 840 and/or the conductive paths 850 of the connector 840 may be connected to the I/O connections 856 in various ways and/or using various technologies. For example, the conductive paths 850 may be soldered to the I/O connections 856 and/or connected to the I/O connections 856 using BGA technology. In some example configurations, the connector 840 and/or the conductive paths 850 may be connected to the second substrate 808 and/or the I/O connections 856 in the same or in a similar way that the connector 840 and/or the conductive paths 850 may be connected to the first substrate 804 and/or the I/O connections 852.

The connector 840 may also include a housing 860 that houses and/or provides protection for the conductive paths 850. The housing 860 may be made of a nonconductive material, such as plastic, polyimide, epoxy-based materials, or polytetrafluoroethylene (PTFE), as examples. The conductive paths 850 may be configured to be electrically insulated from each other within the housing 860. In addition to housing and/or providing protection for the conductive paths 850, the housing 860 may be configured as a support structure for the second substrate 808 to support the second substrate in an elevated and/or extended position away from the first substrate 804 as well as from a main board (such as the main board 730 shown in FIG. 7A). The housing 860 may be configured to connect the first substrate 804 with the second substrate 808 so that the first substrate 804 and the second substrate 808 are positioned parallel or substantially parallel with each other.

Referring back to FIG. 7A, multiple connectors 740 may be used to provide a sufficient number of the conductive paths between conductive traces in the first substrate 704 and conductive traces in the second substrate 708 and also to provide sufficient support for the second substrate 708 so that the second substrate 708 may be stably and/or securely elevated, expanded away from, and/or positioned parallel to the first substrate 704. In addition or alternatively, a number of connectors 740 may correspond to and/or be determined by the number of second electronic devices 706. For example, there may be a one-to-one correspondence between the number of connectors 740 and the number of secondary devices 740. Alternatively, there may be more connectors 740 than secondary devices 706, or vice versa. In addition or alternatively, there the number of connectors 740 may correspond to the number of pieces making up the second substrate 708. For example, an apparatus having a second substrate configured as substrate 508 shown in FIG. 5 may have at least two connectors, at least one connector for each of the pieces 508a, 508b. Similarly, an apparatus having a second substrate configured as substrate 608 shown in FIG. 6 may have at least four connectors, at least one connector for each of the pieces 608a, 608b, 608c, 608d. Various configurations are possible.

Figure 9A:
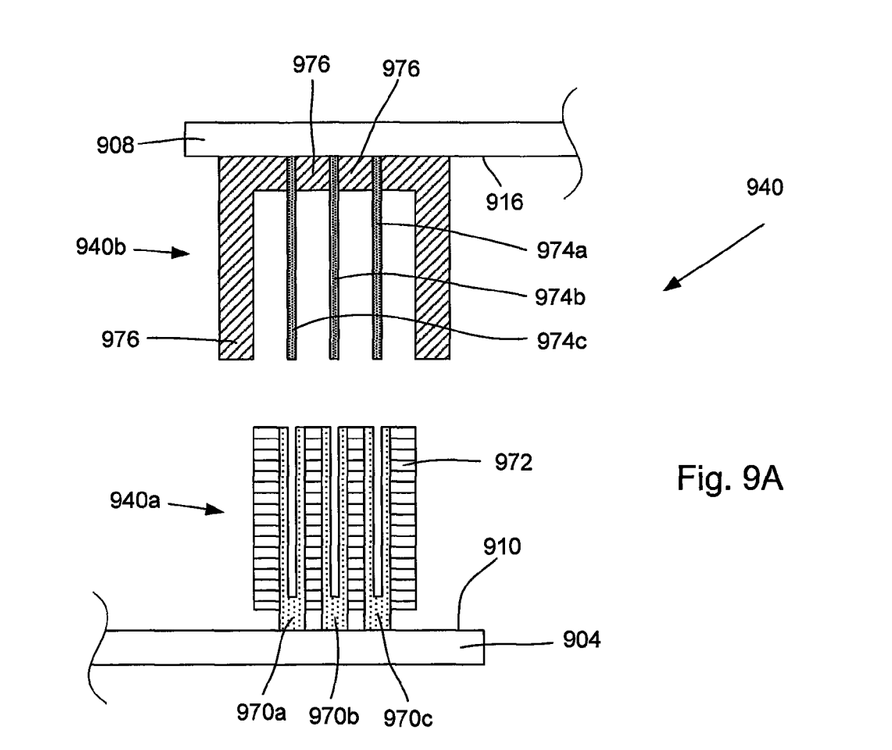
FIGS. 9A and 9B illustrate a cross-sectional side view of an example socket system that is configured to connect a first substrate with a second substrate.
Figure 9B:
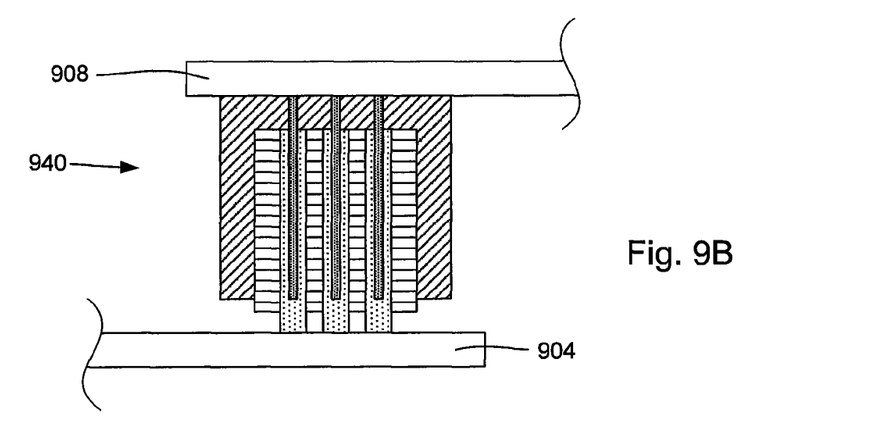

FIGS. 9A and 9B show cross-sectional side views of an example connector 940 that may be used as the connector 740 shown in FIG. 7A. The example connector 940 may be configured as a socket system. The socket system 940 may include two components, a socket component 940a and a pin component 940b. The socket component 940a and the pin component 940b may be fixedly attached to different substrates 904, 908. Further, the socket component 940a and the pin component 940b may be fixedly attached to surfaces of the different substrates 904, 908 that face each other. In one example, as shown in FIGS. 9A and 9B, the socket component 940a is fixedly attached to a top surface 910 of the first substrate 904 and the pin component 940b is fixedly attached to a bottom surface 916 of the second substrate 908. In other configurations, the socket component 940a may be fixedly attached to the bottom surface 916 and the pin component 940b may be fixedly attached to the top surface 910.

The socket component 940a may include one or more sockets 970. The sockets 970 may be connected to I/O connections (such as the I/O connections 852 shown in FIG. 8) that are disposed in and/or on the first substrate 904. In one example, the sockets 970 may be soldered to the I/O connections to provide a fixed connection. The socket component 940a may also include a spacer component or socket body 972 made of an insulating and/or polymer material that spaces apart and insulates the sockets 970 from each other. FIG. 9 shows three sockets 970a, 970b, 970c, although any number of sockets may be used. The number may correspond to the number of I/O connections and/or traces to that the socket component 940a is configured to connect to. In addition or alternatively, the sockets 970 may be configured as a two-dimensional array, forming a socket field.

The pin component 940b may include one or more pins 972. The pins 972 may be connected to I/O connections (e.g., the I/O connections 856 shown in FIG. 8) that are disposed in and/or on the second substrate 908. In one example, the pins 974 may be soldered to the I/O connections to provide a fixed connection. The pin component 940b may also include a housing 976 that is configured to house and/or protect the pins 970. The housing 976 may also be configured to separate and/or insulate the pins 970 from each other at a base of the pin component 940b where the pins 970 are connected to the second substrate 908. In addition, the housing 976 may be fixedly attached to the second substrate 908. FIG. 9 shows three pins, 974a, 974b, 974c, although any number of pins may be used. The number of pins 970 may correspond to the number of sockets 970, or vice versa. In addition or alternatively, the pins 974 may be configured as a two-dimensional array, forming a pin field.

The pin component 940b may be configured to engage with and connect to the socket component 940a. As such, the socket system 940 may be configured to be movable between an engaged position and a disengaged position. When the socket system 940 is in the disengaged position, the pin component 940b is disengaged with and/or unconnected from the socket component 940*a*. Alternatively, when the socket system 940 is in the engaged position, the pin component 940*b* is connected to the socket component 940. FIG. 9A shows the socket system 940 in the disengaged position. In the disengaged position, any signals propagating in the conductive traces disposed in and/or on the first substrate 904 are not sent to and/or received by conductive traces disposed in and/or on the second substrate 908 via the pins 974. Similarly, in the disengaged position, any signals propagating in the conductive traces disposed in and/or on the second substrate 908 are not sent to and/or received by conductive traces disposed in and/or on the first substrate 904 via the sockets 970.

In the engaged position, the pin component 940*b* is engaged with and/or connected to the socket component 940*b*. Each of the sockets 970 may be configured to have openings. To move to the engaged position, the pins 974 may be inserted into the openings of the sockets 970. Each of the sockets 970 and the pins 974 may be made of a conductive material, such as copper or gold. When the socket system 940 is in the engaged position, the sockets 970 and pins 974 may be connected to form conductive paths that electrically connect the first substrate 904 with the second substrate 908.

In addition, when the socket system 940 is in the engaged position, the sockets 970 and the pins 974 may be removably attached and/or removably connected to each other. By being removably attached and/or connected, the socket component 940*a* and the pin component 940*b* may be electrically connected to each other unless and/or until a threshold bias is applied to one of the components 940*a*, 940*b*, which disconnects the component 940*a*, 940*b* from the other component and moves the socket system into the disengaged position. For example, when the threshold bias is applied to the pin component 940*b* in a direction away from the socket component 940, the pin component 940*b* may be disengaged and/or disconnected from the socket component 940*a*.

The socket system 940 may provide a modular (or plug-in-play) configuration for an apparatus, e.g., the apparatus 700 shown in FIG. 7A. For example, referring back to FIG. 7A, the second electronic device 706 mounted on the second substrate 708 may be components of a module, such as a memory module. By having a component of the socket system 940, either the socket component 940*a* or the pin component 940*b*, the module may be configured for removable attachment to the first substrate 706. By being configured for modularity, the second substrate may be initially attached to the apparatus, then removed from the apparatus, and then reattached to the apparatus. Alternatively, after the second substrate is removed, a new second substrate may be attached to the apparatus. The new second substrate may be similar in dimensions to the second apparatus that it replaced. Also, a new electronic device mounted on the new second substrate may be of a same or similar type as the second electronic device 706 mounted on the replaced second substrate. Alternatively, the new electronic device may be an upgrade to the second electronic device mounted on the old replaced second substrate.

The ability to attached and remove the second substrate may conserve resources and/or yield significant cost savings. To illustrate, the first electronic device (e.g., the first electronic device 702) may be an integrated circuit, such as an ASIC or a FPGA, and the second electronic devices (e.g., the second electronic devices 706) may include a plurality of memory devices. The memory devices mounted on the second substrate may be a memory module. The integrated circuit 706 may cost significantly more than the memory devices 706. During operation of the apparatus 700, one or more of the memory devices 706 may fail. The apparatus 700 may undergo testing, which identifies the failed memory device 706. Rather than discard the entire apparatus 700, the second substrate 708, the memory module, or at least a portion of the memory module having the failed memory device 706 mounted on it, may be removed from the apparatus 700. A new second substrate having an operable memory device may then replace the old memory module that was removed. The new memory module may be removably attached and/or connected to the apparatus 700. By replacing the failed memory device without having to discard the entire apparatus, significant cost savings may be experienced.

In addition or alternatively, by being configured for modularity, the apparatus 700 may be upgradable. Using the example above, where one or more of the memory devices 706 currently connected to the apparatus 700 may be upgraded with new memory devices (e.g., with new memory having improved performance and/or increased storage capacity), the current memory devices may be replaced with upgraded memory devices by removing the second substrate with the current memory devices from the apparatus 700 and attaching a second substrate having the upgraded memory. To replace failed memory and/or upgrade the memory, a type of the current memory may first need to be identified. In some example configurations, the apparatus 700 may include a serial programmable read only memory (SPROM) attached to the second substrate 708 that may be used to identify the type of the current memory. The SPROM may be one of the second electronic devices 706 or alternatively may be a component of the apparatus 700 separate and/or different from the second electronic devices 706.

In addition or alternatively, by being configured for modularity, power routing in the apparatus 700 may be improved. Each of the electronic devices 702, 706 may be required to receive power, such as DC power, in order to operate. Power may be supplied along paths designated for supplying the power. In the modular configuration shown in FIG. 7A, paths delivering power to the first electronic device 702 and the second electronic devices 706 may take more direct routes from the main board 730 to the first and second electronic devices 702, 706 as compared to alternative configurations where the second electronic devices 706 are mounted on the first substrate 704 along with the first electronic device 702. The paths may be less complicated, tortuous, and/or noisy. In the alternative configurations, power may be supplied from the main board 730 to a layer of the first substrate 704, where the power lines fan or spread out to the electronic devices. In the modular configuration shown in FIG. 7A, power lines may be directly routed to the electronic devices 702, 706 without having to first fan or spread out on a layer of the first substrate 704. For example, lines delivering power to the second electronic devices 706 may extend directly from the main board 730, through the first substrate 704, through the connector 740, and to the second electronic devices 706 via conductive paths disposed in and/or on the second substrate 706.

Referring back to FIG. 7A, the apparatus 700 may further include a lid 780. The lid 780 may be disposed adjacent a surface of the first electronic device 702 that opposes a surface of the first electronic device 702 that is connected to the first substrate 704. The lid 780 may also be disposed in an area of the apparatus that is aligned with the gap 718 defined by the second substrate 708. The lid 780 may be adhered and/or affixed to the first electronic device 702 using a glue or an epoxy. The lid may be configured to protect the first electronic device 702. To enhance the protection that the lid 780 provides for the first electronic device, the lid 780 may include side wall or feet 782 that surround and/or encase the first electronic device 702 and are connected to the first substrate 704. The feet 782 may be glued to the first substrate 704. The lid 780 may also be configured to function as a heat spreader and/or transfer heat generated from the first electronic device 702 to a heat sink 786. The lid 780 may be made of a conductive material, such as copper, aluminum, or steel, although other conductive materials may be used.

The heat sink 786 may be disposed adjacent a side of the lid 780 that opposes the side of the lid that is connected to the first electronic device 702. Also, as shown in FIG. 7A, the heat sink 786 may be disposed in an area of the apparatus 700 is in alignment with and/or disposed in the space 718 defined by the second substrate 708. The heat sink 786 may be configured to disperse and/or dissipate heat generated by the first electronic device 702. The heat sink 786 may be made of a conductive material, such as copper or aluminum, as examples. A base 788 of the heat sink 786 may be a portion of the heat sink 786 that is adjacent and/or connected to the lid 780. The heat sink may further include a plurality of fins 790 to assist in heat dissipation. In one example configuration of the heat sink 786 as shown in FIG. 7A, the fins 790 extend from the base 788 of the heat sink 786, and no portion of the base 788 or fins 790 laterally extend over the second substrate 708 and/or the second electronic devices 706. In the example configuration of the heat sink 786 shown in FIG. 7A, the heat sink 786 is configured to dissipate heat generated by the first electronic device 702, but not configured to dissipate heat generated by the second electronic devices 706. The configuration of the heat sink 786 may prevent cross-heating between heat generated from the first electronic device 702 and heat generated from the second electronic devices 706.

Figure 10:
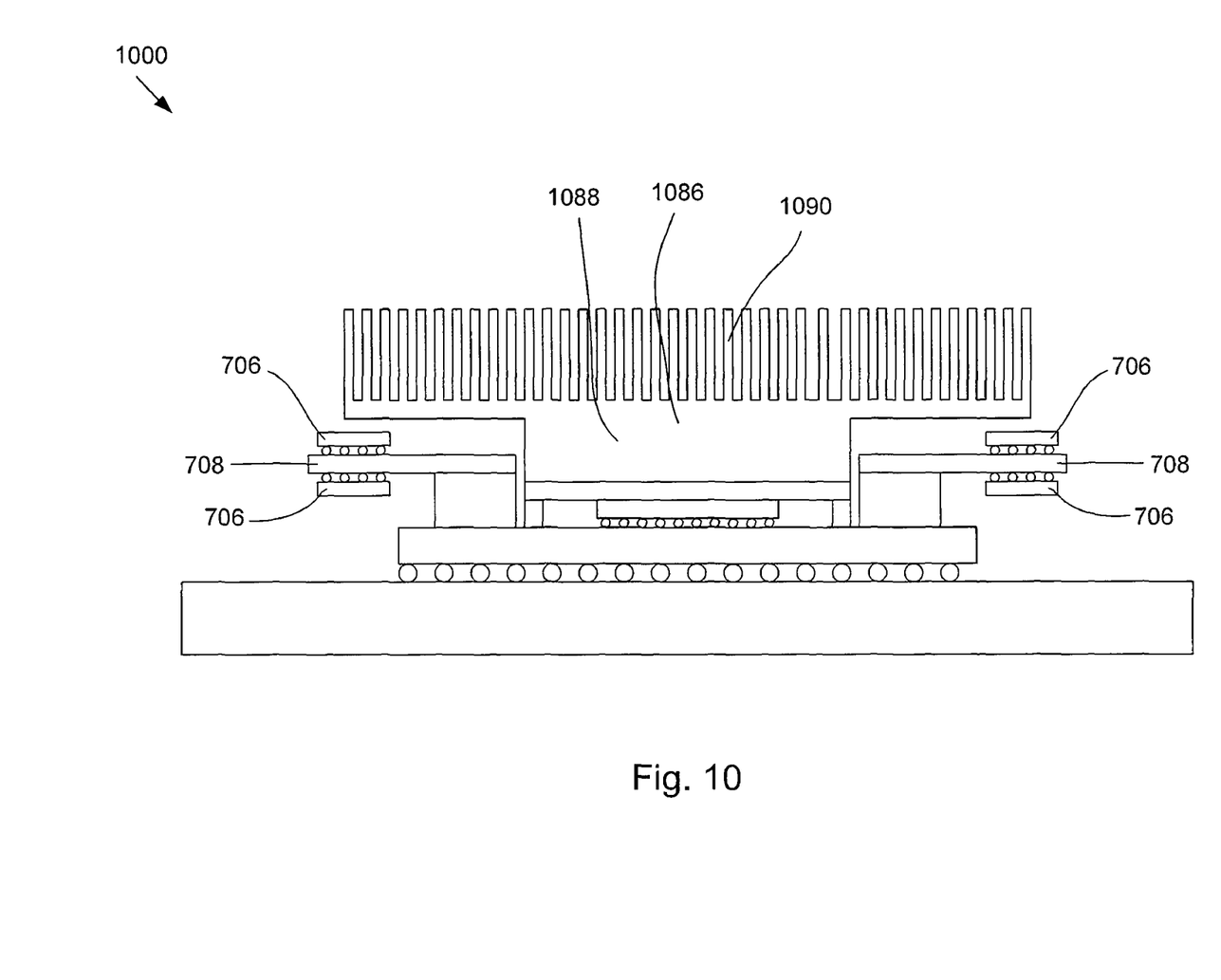
FIG. 10 illustrates a cross-sectional side view of the example apparatus shown in FIG. 7A, and includes an alternative configuration of a heat sink.

FIG. 10 shows an example apparatus 1000, which may be the same as the apparatus 700A shown in FIG. 7A, but with a heat sink 1086 having an alternative configuration to the configuration of heat sink 786. As shown in FIG. 10, the heat sink 1086 has fins 1090 that extend from a base 1088. In addition, the base 1088 and fins 1090 laterally extend over at least a portion of the second substrate 708 and at least a portion of the second electronic devices 706. The configuration of the heat sink 1086 shown in FIG. 10 may be susceptible to cross-heating between heat generated from the first electronic device 702 and the second electronic devices 706. However, the configuration of the heat sink 1086 may be desirable where a heat generated by the second memory devices 706 may require one or more heat sinks, and the addition of a heat sink laterally extending over the second electronic devices may outweigh any negative and/or undesirable effects that cross-heating may cause.

Figure 11:
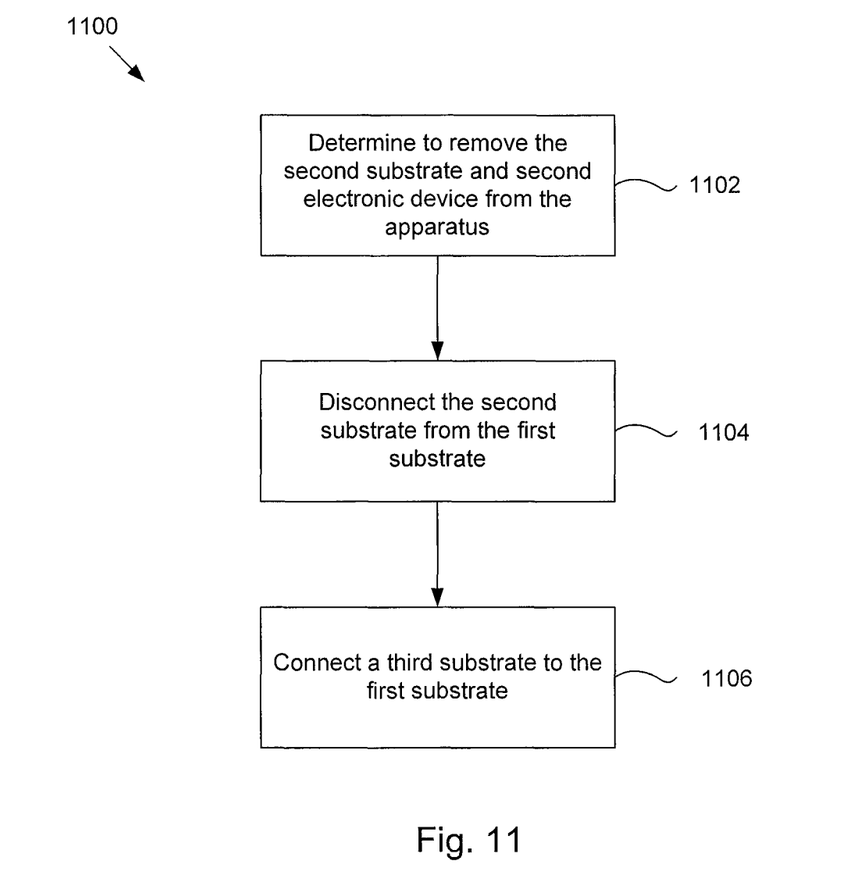
FIG. 11 illustrates a flow diagram of an example method of configuring an apparatus having an electronic device mounted on a first substrate that is removably connected to a second? substrate.

FIG. 11 shows a flow diagram of an example method of configuring an apparatus that has a first electronic device mounted on a first substrate, where the first substrate is configured to be removably connected to a second substrate, and where a second device is mounted on the second substrate. The first electronic device may be configured to communicate with the second electronic device via a path extending through the first substrate and the second substrate when the first substrate is removably connected to the second substrate. Also, the first substrate may be mounted on a main board and/or motherboard of the apparatus. At block 1102, a determination is made to remove the second substrate from apparatus. The determination may be made based on testing the apparatus and identifying that one or more of the second electronic devices mounted on the second substrate has failed. Alternatively, the determination may be made based on determining to upgrade, such as perform a memory upgrade, of one or more of the second electronic devices.

At block 1104, the second substrate may be removed from the apparatus by disconnecting the second substrate from the first substrate. In one example configuration, the second substrate may be disconnected from the first substrate by disengaging or disconnecting a first socket system component that is attached to the second substrate from a second socket system component that is attached to the first substrate. At block 1106, a third substrate may be removably connected to the first substrate. A third electronic device may be mounted on the third substrate. The third electronic device may be of a same type as the second electronic device mounted on the second substrate. In addition, the third substrate may have same and/or similar dimensions as the second substrate. In one example, the third substrate may be connected to the first substrate by connecting a third socket system component to the second socket system component. The third socket system may be attached to the fourth substrate. Also, the third socket system component may of the same type as the first socket system component attached to the second substrate.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

The invention claimed is:

1. An apparatus comprising:
    a first substrate;
    a second substrate including multiple, separate substrate components arranged at least partially surrounding a void, wherein each of the multiple substrate components is removably attached to the first substrate such that each of the multiple substrate components is attachable to the first substrate, removable from the first substrate, and reattachable to the first substrate;
    a first electronic device mounted on the first substrate in an alignment with the void; and
    one or more second electronic devices mounted on the second substrate, wherein at least one of the one or more second electronic devices is mounted on one or more of the multiple substrate components,
    wherein the first electronic device is configured to communicate with the one or more second electronic devices via a path extending through the first substrate and the second substrate, and
    wherein the first substrate is mounted on a third substrate.

2. The apparatus of claim 1, wherein each of the multiple substrate components comprises a connector that is configured to removably attach the component to the first substrate in order to:
    electrically connect the first electronic device and the one or more second electronic devices; and
    maintain all of the substrate components of the second substrate a predetermined distance away from the first substrate.

3. The apparatus of claim 1, wherein the one or more second electronic devices comprise at least two second electronic devices mounted on opposing planar surfaces of the second substrate.

4. The apparatus of claim 1, wherein the first substrate comprises an organic substrate, the third substrate comprises a motherboard, wherein the organic substrate is mounted on the motherboard using ball grid array technology, and wherein a socket system connects the second substrate with the organic substrate.

5. The apparatus of claim 1, further comprising a heat sink configured to dissipate heat generated by the first electronic device, wherein at least a portion of the heat sink is disposed within the void.

6. The apparatus of claim 1, wherein the multiple substrate components of the second substrate form a contiguous structure having a rectangular outer perimeter.

7. The apparatus of claim 1, wherein the multiple substrate components of the second substrate form a discontiguous structure.

8. The apparatus of claim 1, wherein the first electronic device is an integrated circuit and the one or more second electronic devices are memory chips.

9. The apparatus of claim 2, wherein the connector comprises a socket system that is configured to removably connect the first substrate with the second substrate.

10. The apparatus of claim 5, wherein the heat sink comprises a portion that extends over a portion of the one or more second electronic devices.

11. The apparatus of claim 9, wherein the connector is further configured to maintain a space between the second substrate and the third substrate, the space having a length greater than a height of the one or more second electronic devices.

12. An apparatus comprising:
a motherboard;
a substrate mounted on the motherboard;
an integrated circuit mounted on the substrate; and
a plurality of memory modules, each module of the plurality of memory modules being separately and removably attached to the substrate, and wherein the plurality of memory modules is configured to at least partially surround an internal void and the integrated circuit is mounted on an area of the substrate that is aligned with the internal void,
wherein removable attachment of one of the memory modules to the substrate brings the memory module into electrical communication with the integrated circuit.

13. The apparatus of claim 12, wherein the substrate comprises a first substrate, and wherein each memory module comprises a memory chip mounted on a second substrate.

14. The apparatus of claim 12, further comprising a socket system that is configured to removably attach each memory module to the substrate.

15. The apparatus of claim 13, wherein the first substrate comprises an organic substrate configured to widen a pitch of input/output connections of the integrated circuit for communication with the second substrate.

16. An apparatus comprising:
a main board;
a first substrate mounted to the main board;
a first electronic device mounted on the first substrate;
a plurality of modules removably attachable to the first substrate, each of the plurality of modules being separately removably attachable to the first substrate, and comprising:
a second substrate including opposing planar surfaces; and
at least one second electronic device mounted to at least one of the planar surfaces,
wherein each module is configured to removably attach directly to the first substrate in a manner that electrically connects the at least one second electronic device with the first electronic device and defines a void aligned with the first electronic device.

17. The apparatus of claim 16, wherein at least a portion of the second substrate of each of the modules extends beyond the first substrate when attached thereto, such that a gap with a length that is larger than a height of the at least one second electronic device is defined between the portion of the second substrate and the main board.

18. The apparatus of claim 16, wherein the opposing planar surfaces include the same configuration of second electronic devices.

19. The apparatus of claim 16, wherein the first substrate is aligned with the void.

* * * * *